(12) United States Patent
Kumar et al.

(10) Patent No.: US 8,963,117 B2
(45) Date of Patent: Feb. 24, 2015

(54) REDUCTION OF FORMING VOLTAGE IN SEMICONDUCTOR DEVICES

(71) Applicant: Intermolecular Inc., San Jose, CA (US)

(72) Inventors: Pragati Kumar, Santa Clara, CA (US); Tony P. Chiang, Campbell, CA (US); Prashant B Phatak, San Jose, CA (US); Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/018,719

(22) Filed: Sep. 5, 2013

(65) Prior Publication Data

US 2014/0001431 A1 Jan. 2, 2014

Related U.S. Application Data

(63) Continuation of application No. 12/391,784, filed on Feb. 24, 2009, now Pat. No. 8,551,809.

(60) Provisional application No. 61/058,702, filed on Jun. 4, 2008, provisional application No. 61/052,172, filed on May 10, 2008, provisional application No. 61/052,174, filed on May 10, 2008, provisional application No. 61/049,752, filed on May 1, 2008.

(51) Int. Cl.
*H01L 47/00* (2006.01)
*H01L 45/00* (2006.01)
*G11C 13/00* (2006.01)
*H01L 27/24* (2006.01)

(52) U.S. Cl.
CPC ............ *H01L 45/1253* (2013.01); *H01L 45/08* (2013.01); *H01L 45/10* (2013.01); *H01L 45/1233* (2013.01); *H01L 45/146* (2013.01); *H01L 45/1625* (2013.01); *H01L 45/1641* (2013.01); *G11C 13/0002* (2013.01); *G11C 2013/0083* (2013.01); *G11C 2213/51* (2013.01); *H01L 27/2409* (2013.01); *H01L 27/2463* (2013.01)
USPC ...................................... 257/4; 257/E45.003

(58) Field of Classification Search
None
See application file for complete search history.

(56) References Cited

U.S. PATENT DOCUMENTS

| | | | |
|---|---|---|---|
| 2007/0200158 A1* | 8/2007 | Genrikh et al. ............... | 257/306 |
| 2007/0252193 A1* | 11/2007 | Cho et al. ...................... | 257/315 |
| 2007/0267675 A1* | 11/2007 | Cho et al. ...................... | 257/306 |
| 2007/0281412 A1* | 12/2007 | Kawai et al. .................. | 438/197 |
| 2008/0304312 A1* | 12/2008 | Ho et al. ........................ | 365/148 |
| 2009/0001344 A1* | 1/2009 | Schricker et al. ................ | 257/4 |

* cited by examiner

*Primary Examiner* — Daniel Luke

(57) ABSTRACT

This disclosure provides a nonvolatile memory device and related methods of manufacture and operation. The device may include one or more resistive random access memory (ReRAM) approaches to provide a memory device with more predictable operation. In particular, the forming voltage required by particular designs may be reduced through the use of a barrier layer, a reverse polarity forming voltage pulse, a forming voltage pulse where electrons are injected from a lower work function electrode, or an anneal in a reducing environment. One or more of these techniques may be applied, depending on the desired application and results.

17 Claims, 8 Drawing Sheets

REDUCTION OF FORMING VOLTAGE IN SEMICONDUCTOR DEVICES

CROSS-REFERENCE TO RELATED APPLICATIONS

This application is a continuation claiming priority to U.S. patent application Ser. No. 12/391,784 filed 24 Feb. 2009, which in turn claims priority to U.S. Provisional Pat. App. Ser. Nos. 61/049,752 filed 1 May 2008, 61/052,174 filed 10 May 2008, 61/052,172 filed 10 May 2008, and 61/058,702 filed 4 Jun. 2008. All of these priority documents are entirely incorporated by reference herein for all purposes.

BACKGROUND

Nonvolatile memory architectures use materials exhibiting two or more stable states to retain stored information even in the absence of power. Each memory cell usually includes two electrodes and one or more materials between the electrodes; to change state, a voltage difference is created across the cell to induce current flow, with a first current flow "setting" a state and a second current flow "resetting" that state. Depending on architecture, the current flows used to change state can be made different, for example, different in magnitude or polarity (direction), or they can be the same.

Certain nonvolatile memory architectures use a "forming process," to prepare a memory device for use. In a forming process, an initial, generally higher current flow (i.e., based on a voltage difference) is needed to help change state for the very first time, after which the operation of the device becomes relatively more consistent. The forming process is typically applied at the factory, at assembly, or at initial system configuration.

Such a forming process presents at least two disadvantages to memory devices, including that (a) it can be difficult or expensive in terms of silicon to generate or support a higher voltage associated with the forming process, and (b) the use of generally higher currents presents a risk of damaging memory cells and causing failure, through electric field damage or other forms of overload.

What is needed is an improved device or method that does not require a high forming voltage (or forming current). The present invention satisfies this need and provides further, related advantages.

BRIEF DESCRIPTION OF DRAWINGS

FIG. 2A shows curves 203 and 207 associated with a bistable memory device, showing each of a high resistance state and low resistance state, respectively.

FIG. 2B is used to compare an Ohmic response 223 with a non-linear response 227 (the latter being desired for operation of a multistable memory device).

DETAILED DESCRIPTION OF EXAMPLE EMBODIMENTS

The invention defined by the enumerated claims may be better understood by referring to the following detailed description, which should be read in conjunction with the accompanying drawings. This description of one or more particular embodiments, set out below to enable one to build and use various implementations of the invention or inventions set forth by the claims, is not intended to limit the enumerated claims, but to exemplify their application to certain methods and devices. The description set out below exemplifies methods and devices that can benefit from a reduced forming voltage. In particular, the description below provides examples of (i) a nonvolatile memory device that includes a barrier layer material, (ii) a method of fabricating a nonvolatile memory device using an anneal process and a reducing environment, and (iii) a forming process based on a reverse polarity (e.g., injecting electrons via a device anode); other related methods and devices are also presented. In this document, "about" shall mean "within ±10% of."

I. Introduction

Figure 1:
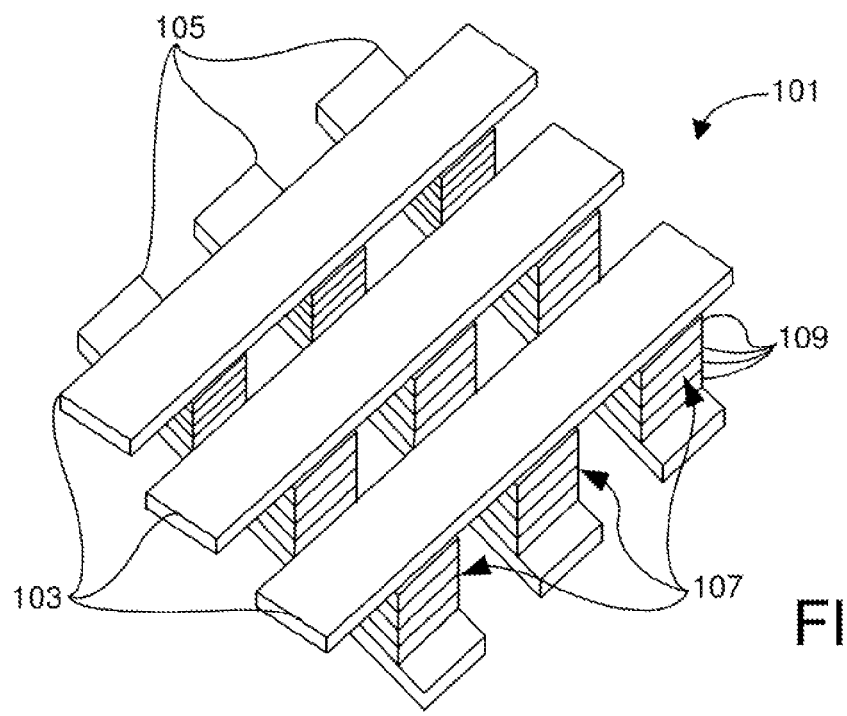
FIG. 1 is a three-dimensional view depicting components of an array 101 of multistable memory cells. Each cell if desired may be fabricated according to the principles described herein.
Figure 2A:
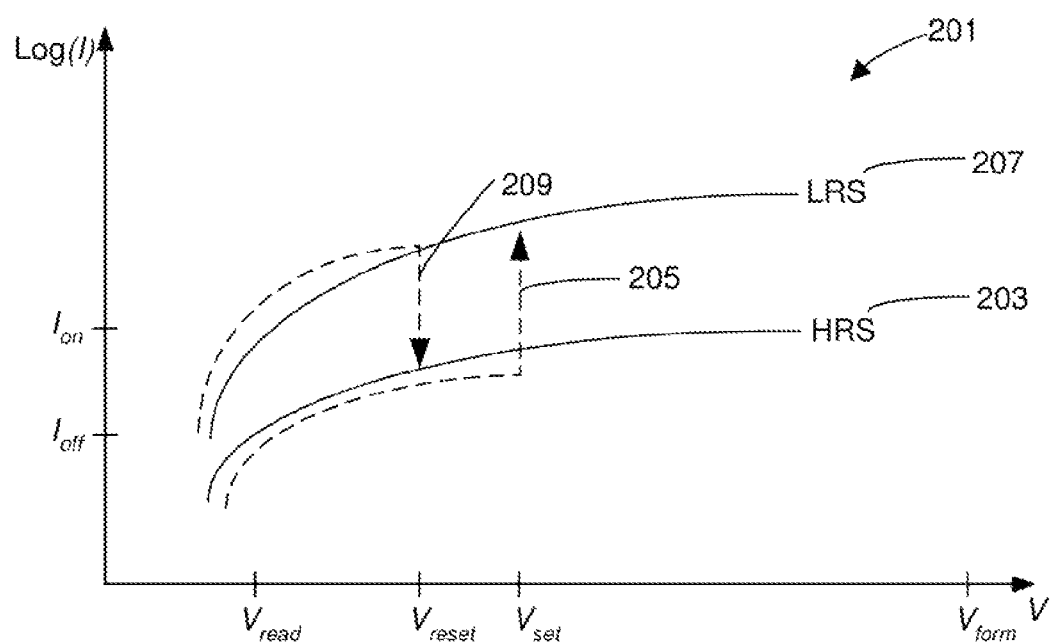
FIG. 2A presents a graph 201 that plots current versus voltage characteristics of a multistable memory device. In particular.
Figure 2B:
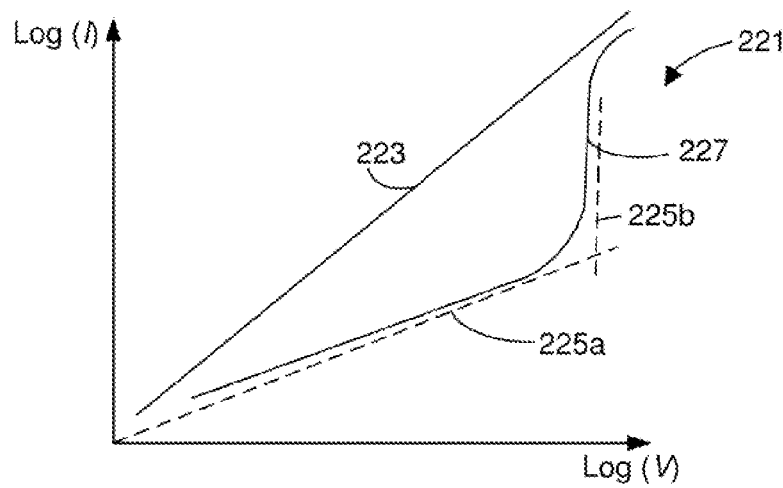
FIG. 2B presents a graph 221 that shows current versus voltage characteristics for multistable memory cells.

In the discussion that follows, FIG. 1 will be used to illustrate a device based on an array of non-volatile memory cells, with FIGS. 2A-2B being used to illustrate operation of a resistive-switching technology memory device (resistive RAM, or "ReRAM"). The discussion will then proceed to embodiments that use a metal-insulator-metal ("MIM") stack configuration, including different materials options, with reference to FIGS. 3A-3D. An embodiment that uses non-metallic conduction mechanisms will be discussed in this context. FIG. 4 will be used to introduce general methods that may be used to enhance the structures introduced by the previous figures. Following this portion of the description, FIGS. 5-12 will be used to discuss specific devices and methods, including (a) a nonvolatile device having a barrier layer, (b) a nonvolatile memory device and related fabrication method that is based on a reducing anneal, and finally, (c) a forming process for a memory device that is based on a reverse polarity forming voltage or the injection of electrons into a lower work function electrode. Some or all of these embodiments facilitate a reduced forming voltage, meaning that the teachings presented by this disclosure may promote greater device reliability by minimizing forming voltage damage. The teachings presented represented by these embodiments may be extended to other devices, methods and systems.

The embodiments discussed below are primarily couched in terms of memories having resistance which may be selectively changed to represent stored information ("resistive RAM" or "ReRAM"), but the teachings of this disclosure may be applied to other forms of memory. For example, a number of designs for non-volatile memories have been proposed, including designs based on flash memory, phase or state change memory, magnetic random access memory ("magnetic RAM" or "MRAM"), flash memory (NAND or NOR based), SONOS, metalized RAM, nanowire RAM and a number of other technologies. Although known by a wide number of acronyms and names, these designs usually are based on a material (usually a metal or semiconductor) or a combination of materials that reversibly changes a physical or electrical state under the application of a voltage, field, current, or other effect; the state can be nondestructively sensed, thereby permitting use of the state for information storage. It should be possible to apply teachings from this disclosure to these other non-volatile memory forms as well, i.e., some of these memory devices may use different state storage structures, such as a floating gate, charge storage device or layer, or bulk mediated mechanism, but they generally each use some form of current flow or voltage different to change state that may, at least in some implementations, benefit from the principles introduced herein.

As seen in FIG. 1, a device may be fabricated to have an array 101 with a number of nonvolatile memory cells 103. The array includes a first set of signal lines 103 and a second set of signal lines 105, the two sets being substantially orthogonal to each other such that they cross, with a memory cell 107 being defined at each intersection. Each memory cell is composed of one or more layers of materials (such as represented by numeral 109), with each cell at least including at least two electrodes and a semiconductor material therebetween. The cells may include other optional layers, including current steering devices built within each memory cell (e.g., a diode or transistor), smoothing layers, defect access layers, and other such structures. The two electrodes are generally metal and may consist of the signal lines themselves, or a separate layer electrically conductive with one or the other of the signal lines. The two sets of signal lines 103 and 105 may be arranged in any format desired, e.g., with one set defining a row while the other defines a column, or with one set defining a word with the other defining a bit, or in some other arrangement. In the array 101 depicted in FIG. 1, each cell can store one or more "bits" of information, with the array as a whole storing a large amount of digital information. While each cell is exemplified in FIG. 1 as a vertical stack, it is possible to have either horizontal or vertical structures, depending on design. Each cell may be a single-level or multi-level design, or may be otherwise configured to represent two or more states of information. In the example of FIG. 1, it should be assumed that each cell is a bistable memory cell, meaning that the cell can be controlled to change resistance between two states, including a high resistance state and a low resistance state, and that this transition may be used to represent stored digital information.

A. Use of ReRAM Cells.

FIGS. 2A-B are used to explain the operation of such a ReRAM cell, with each of these FIGS. showing a voltage/current curve. FIG. 2A helps illustrate the use set and reset operations that are relied upon to change the contents of the memory cell. Initially, the cell may be in a high resistance state (denoted by the label "HRS" in FIG. 2A, e.g., representing a logic "zero"). The current and voltage characteristics of this state are represented by a first curve 203. This high resistance state may be sensed by read and write circuitry using the different sets of signal lines (e.g., column and row lines) as was previously described. For example, read and write circuitry may apply a read voltage Vread across the cell for the purpose of sensing the resulting "on" or "off" current (Ion or Ioff) that flows through the cell and its semiconductor device layer or layers. When it is desired to store a logic "one," the cell can be placed into its low resistance state by using read and write circuitry to apply a set voltage Vset across the signal lines. The set voltage is typically greater than the read voltage and causes the cell to transition to its low resistance state, as indicated by dashed line 205, to the state represented by the acronym "LRS;" the voltage and current characteristics of this state are denoted by a second curve 207.

The mechanism associated with change in the resistive state is not precisely understood, but it may be effectuated by reason of the filling of traps (i.e., a may be "trap-mediated") in a metal oxide material. That is to say, each memory cell has a semiconductor layer (i.e., a material such as a metal oxide) having defects. Generally, defects are formed in the deposited metal oxide or can be enhanced by additional processes. Defects may take the form of variances in charge in the structure of the metal oxide. For example, some charge carriers may be absent from the structure (i.e., vacancies) or additional charge carriers may be present (i.e., interstitials). These defects may also be, depending on material, created or enhanced at the boundary of a metal oxide layer and another layer within the MIM structure. By applying a voltage to the multistable structure introduced above, the defects, such as traps, can either be filled or emptied to alter the resistivity of each cell. The switching mechanisms form percolation paths through the bulk of the metal oxide which may be formed during a set operation and broken during a reset operation.

Depending upon fabrication process, post-fabrication, the defects must typically be "set" for the very first time and this initial state change may require a significant amount more work than after the device has been cycled a number of times. It is for this reason that a forming process is sometimes applied to certain nonvolatile memory designs. For example, although the setting and resetting of a particular cell design might involve valence state change for a particular atomic species between multiple levels, the fabrication process may not produce a semiconductor layer that as a whole exactly matches electrical properties that would be seen after the layer has been cycled between states several times. A forming process may thus be used to bring the memory cell to one of the base states, after which repeatable operation can be expected. It is for this reason that a forming voltage V form is also depicted in FIG. 2A; this voltage represents the maximum voltage used to cause the memory cell to initially change state. After one or more "forming pulses," the cell settles to a repeatable pattern represented by the "on" and "off" (the "set" and "reset") states represented in FIGS. 2A and 2B.

As with the high resistance state, the low resistance state "LRS" of the cell can also be sensed using the read and write circuitry. When a "read" voltage Vread is applied to the cell, read and write circuitry will sense the magnitude of the current flow which, given the relatively lower resistance, will be higher than magnitude of the "off" current. The magnitude of this "on" current Ion indicates that the cell is in its low resistance state. When it is desired to store a logic "zero" in the cell, a reset voltage Vreset is placed across the cell to change its resistance state back the high resistance state HRS, as indicated by dashed line 209. The reset voltage is typically also greater than the "read" voltage and, in at least one embodiment, may be made to be of opposite polarity with respect to the set voltage. As with the forming voltage or "pulse," voltage pulses of appropriate amplitude and duration can be used for purposes of the set and reset operations just described.

As mentioned, the change in the resistive state may be effectuated by reason of the filling of traps (i.e., a may be "trap-mediated") in a metal oxide material. FIG. 2B presents a graph 221 of the logarithm of current (I) versus log of voltage (V) for a bistable memory cell. A straight line 223 represents the generally linear response of an Ohmic material when a ramped voltage is applied. Such a response is undesirable, since there is no discrete voltage at which a state change (set or reset) occurs. A response of a material or combination of materials especially suitable for bistable resistance operations is indicated by two intersecting, dashed lines 225a and 225b, with an abrupt change in current response occurring at a specific voltage. In practice, an appropriate response might follow a curve indicated by reference numeral 227, where the discontinuity (rapid increase in current) occurs at a set voltage, where the bistable cell switches from the high resistance state to the low resistance state.

The multistable resistance characteristic just described makes the memory cell suitable for storing digital data. Because data may be reliably stored in the absence of application of the described voltages, the cell may be considered nonvolatile. In many implementations, it may be desirable for the cell to have a large difference between "off" current and "on" current (e.g., a relatively high Ion/Ioff ratio), which renders the states of the cell more easily discriminated.

As indicated above in connection with FIG. 1, each memory cell can be formed as a multilayer structure having two electrodes and a layer of semiconductor material between these electrodes, for example, as a metal-insulator-metal ("MIM") structure. The semiconductor device layer typically will include a metal oxide layer that includes an oxide of at least one metal and that that blends together the metal, metal oxide and oxygen with unknown, potentially complex bonding characteristics. The term "MIM" as used herein should be understood to potentially include other layers, and to encompass metal-insulator-insulator-metal, metal-insulator-insulator-insulator-metal, metal-insulator-metal-insulator-metal and other, similar structures, including structures with other enhancement layers between them (e.g., to promote adherence of other layers). Without being bound by theory, it is believed that the multistable structure described above uses a switching mechanism that is at least partially mediated in the bulk of the metal oxide layer. In one embodiment, the switching mechanism uses non-metallic conductive paths rather than filamentary or metallic conductive paths.

For example, in a multistable structure, during a set operation, the memory cell switches to a lower resistance state. The percolation paths that are formed by filling traps increase the conductivity of the metal oxide, thereby reducing (i.e., changing) the resistivity. At this voltage, traps are filled and there is a large jump in current as the resistivity of the metal oxide decreases.

Notably, at various times in this disclosure, "a" semiconductor layer will be referenced. It should be understood that such a layer can be a single layer, composed of a single material (e.g., a single metal oxide), or alternatively, as a sequence of layers, composed of the same or different materials (e.g., different metal oxides). For example, an atomic layer deposition ("ALD") process will be referenced further below, used for reactive fabrication of the semiconductor layer—the "layer" created by such a process will necessarily be comprised of many discrete layers, each layer having an atomic scale thickness (thus, the process term "atomic layer"). All such materials and combinations, a single indivisible layer or plurality of "microlayers," and use of one or more materials in a layer, are encompassed by the term "layer."

B. Effect of Materials on Cell/Array Properties.

Figure 3A:
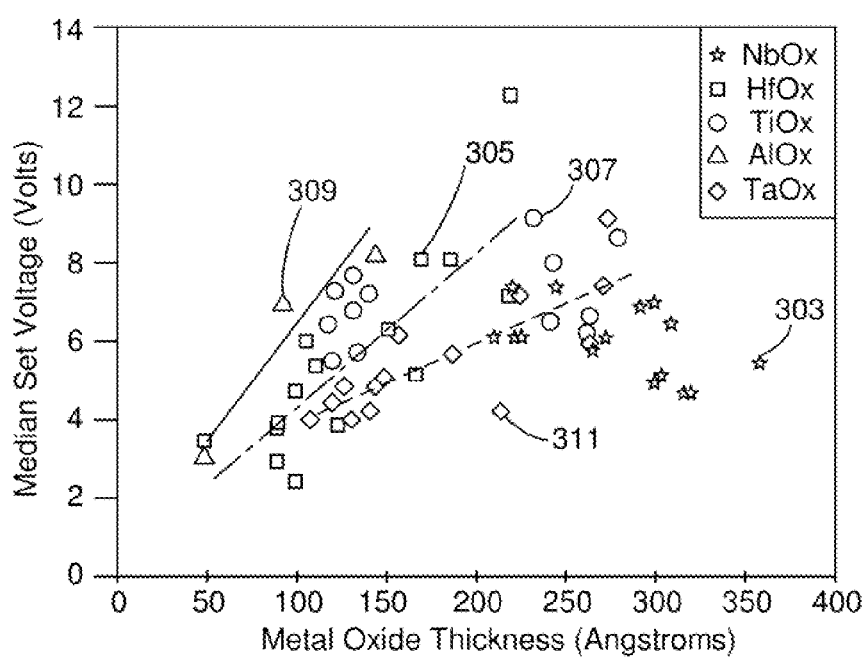
FIG. 3A presents a graph 301 showing the relationship between thickness of a metal oxide layer and median set voltage for multistable memory device. Different types of points are represented by different shapes 303, 305, 307, 309 and 311. Each set of points is associated with a different type of metal oxide usable for the semiconductor device layer of a multistable memory cell.
Figure 3B:
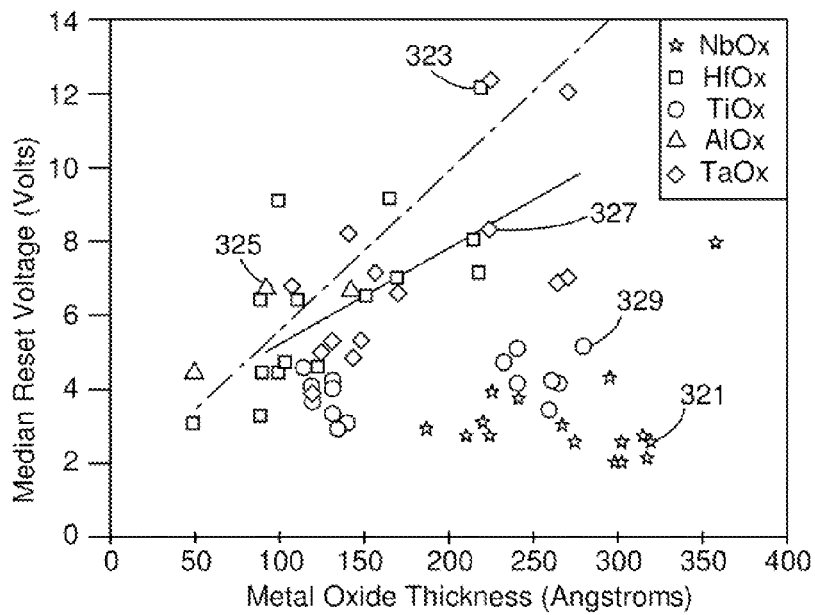
FIG. 3B presents a graph 321 showing the relationship between thickness of a metal oxide layer and median reset voltage for multistable memory device. Different types of points are represented by different shapes 323, 325, 327, 329 and 321. Each set of points is associated with a different type of metal oxide usable for the semiconductor device layer of a multistable memory cell.
Figure 4:
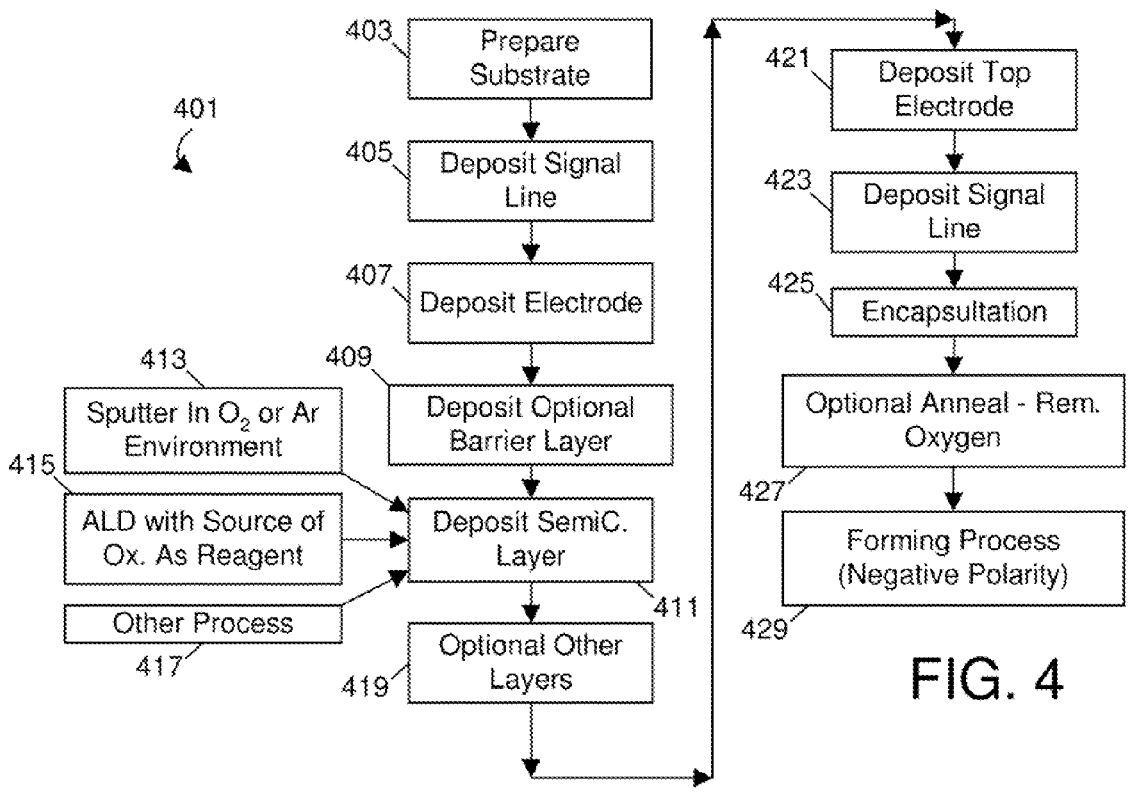
FIG. 4 provides a flow chart 401 that helps illustrate a fabrication method for a non-volatile memory array.

FIGS. 3A and 3B show the relationship between thicknesses of a metal oxide layer and resulting set and reset voltages. These graphs represent data for a system that includes two electrodes and a single layer of metal oxide disposed in between. FIG. 3A provides a chart 301 that identifies median set voltage (in Volts) as a function of metal oxide thickness in Angstroms, for oxides of Niobium (303), Hafnium (305), Titanium (307), Aluminum (309) and Tantalum (311). As can be seen in FIG. 3A, for Hafnium Oxide 305, Aluminum Oxide 309, and Tantalum Oxide 311, set voltage increases with (i.e., appears to be dependent on) thickness. In some embodiments, depending on materials used, the set voltage is at least one volt (V) per one hundred angstroms (Å) of the thickness of a metal oxide layer in the memory cell. Also in some embodiments, increases in the thickness of the metal oxide layer of 100 Å increase the set voltage by at least 1V. Similarly, as shown in FIG. 3B, reset voltage for Hafnium Oxide 323, Aluminum Oxide 325, and Tantalum Oxide 327 also depends on thickness. These data therefore support a set/reset mechanism that is at least partly dependent upon bulk for these materials, since FIGS. 3A and 3B indicate a generally linear relationship between both set voltage and thickness and reset voltage and thickness, at least for a range of layer thickness—such a relationship in turn indicates the formation of percolation paths in the bulk of the metal oxide. In other words, for a thicker material, more voltage is needed to fill the traps.

Figure 3C:
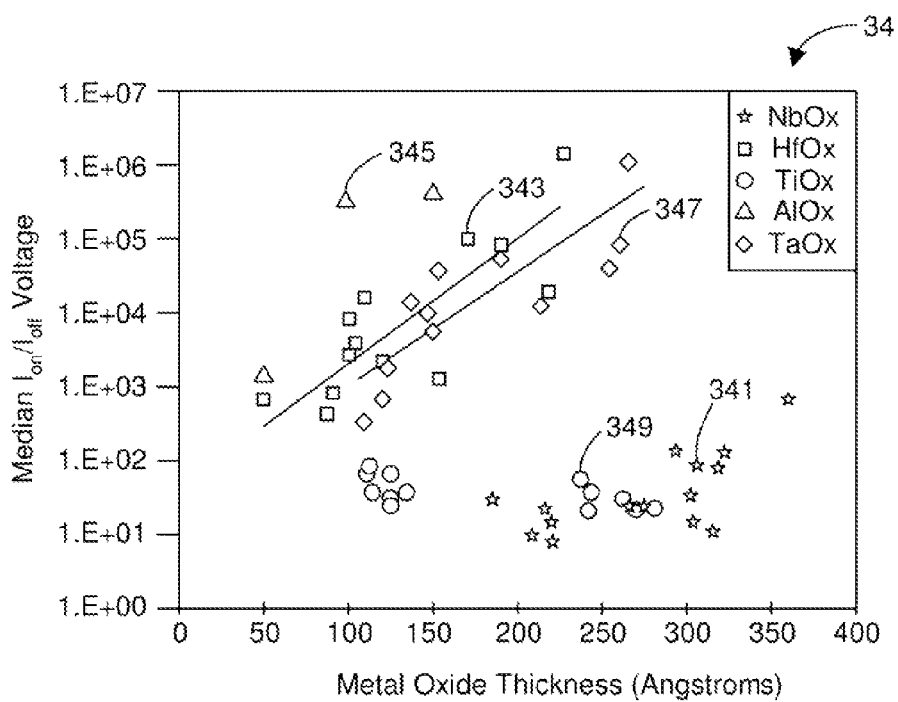
FIG. 3C is a graph showing the relationship between thickness of a metal oxide layer and ratios of "on" current to "off" current ("Ion/Ioff") for several materials used in memory cells described herein. The nomenclature "on" current is used herein to refer to a current flow associated with a state other than the base state (e.g., with the base state being the highest resistance state, in which current flow is lowest) rather than strictly requiring that only two states be present. The data presented in FIG. 3C shows that, for at least certain semiconductor materials, the Ion/Ioff ratio is not linear with semiconductor device layer thickness, and thus supports the notion that resistive switching mechanisms (a) tend to be non-metallic, and (b) are likely generated proximate to the interface between different layers, e.g., such that they may be enhanced by the surface treatment procedures provided by this disclosure.

FIG. 3C presents a graph 341 that identifies the ratio of "on" current to "off" current (Ion/Ioff) for a number of materials, including oxides of Niobium, Hafnium, Titanium, Aluminum and Tantalum. As will be discussed further below, in some embodiments, oxides of Hafnium, Aluminum and Tantalum in particular are of special interest, because they each represent higher bandgap materials, that is, where the bandgap is at least four electron volts (eV). Generally speaking, it may be desired not only to minimize "off" current in a multistable memory device, but also to maximize the difference between current flows associated with each state of the device (i.e., to provide good discrimination between the resistances of "on" and "off" states).

The graph in FIG. 3C indicates two things. First, for higher bandgap materials, a higher ratio of Ion/Ioff can be obtained, as can a ratio that increases somewhat with layer thickness. Second, the data presented in FIG. 3C also indicates a non-origin intersection of data curves (or at least that data may be non-linear for low semiconductor device layer thicknesses). This data, in turn, indicates that multistable properties may also have some correlation with layer interfaces, rather than being rooted in the formation of conductive metal filaments—simply stated, as will be described below in connection with FIG. 3D, it is believed that the conduction mechanisms are non-metallic and are at least partially defined by defects existing at the interface between the semiconductor material layer and an adjacent layer (e.g., an adjacent electrode). This is not to imply that switching mechanisms are engendered only by surface conditions, i.e., the conduction properties may involve some combination of bulk effects and interface effects.

Higher bandgap materials are exemplified by materials such as Hafnium Oxide, Aluminum Oxide and Tantalum Oxide, denoted by data sets 343, 345 and 347 in FIG. 3C. Hafnium Oxide, for example, has a bandgap of 5.7 eV, while Aluminum Oxide and Tantalum Oxide have bandgaps of 8.4 and 4.6 eV, respectively. These materials provide a relatively high Ion/Ioff ratio, substantially better than the ratio associated with data 309 and 311 for Titanium Oxide and Niobium Oxide (both having bandgaps of less than 4.0 eV, 3.0 eV and 3.4 eV, respectively). Thus, it may be preferred in some embodiments to fabricate a semiconductor device layer from materials having a bandgap of at least 4.0 eV, to enhance discrimination between current flows associated with each state of a multistable device. Zirconium Oxide and Yttrium Oxide are also high bandgap materials that it is believed may be also employed to this end. Notably, these materials and processes are exemplary only, and may not be desired for all implementations; for example, while promoting generally high Ion/Ioff ratios, high bandgap materials may not be the most appropriate materials where other electrical characteristics are to be emphasized. By contrast, data associated with the lower bandgap materials (Titanium oxide and Niobium oxide) clearly indicate a linear trend that does not depend on thickness of the metallic oxide layer, which in turn suggests a substantially non-metallic conduction mechanism.

As borne out in connection with FIGS. 3A and 3B, the set and reset voltages for Niobium Oxide and Titanium Oxide appear to be independent of layer thickness (see, e.g., numerals 309 and 311 in FIG. 3A). Each of these materials is a relatively low bandgap material, i.e., having a bandgap of less than 4 eV. Therefore, a higher bandgap (i.e., bandgap greater than 4 eV metal oxide exhibits switching and scalable set and reset voltages that are relatively more dependent on bulk. In other words, set voltage and reset voltage can be reduced by reducing the thickness of the high bandgap metal oxides such as Hafnium Oxide. Therefore, for smaller devices based on these materials, set and reset voltages can be lowered.

As described above in conjunction with FIG. 3C, the percolation paths can be described as non-metallic. With metallic materials, resistivity decreases with lower temperature. The multistable structures described herein demonstrate an increase in resistance with decreases in operating temperatures, a conclusion further supported by FIG. 3D.

Figure 3D:
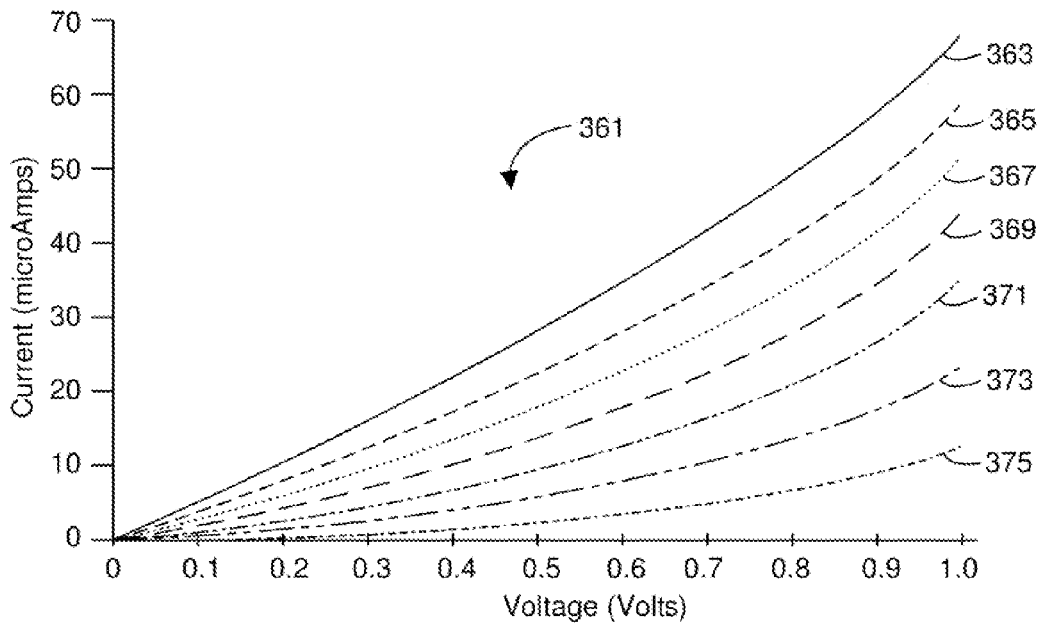
FIG. 3D is a graph 361 that shows a number of curves 363, 365, 367, 369, 361, 363 and 365; the curves are used to illustrate behavior of metal oxides as, effectively, non-metallic substances (i.e., providing non-metallic conduction mechanisms).

FIG. 3D provides a graph 361 that further illustrates a non-metallic nature of metal oxides used for the memory cells described herein. The graph 361 shows increasing resistivity for a high-bandgap (i.e., greater than 4 eV oxide layer with decreasing temperatures, which is a characteristic of a non-metallic material. The graph 361 shows a sweep in voltage on the x-axis versus current on the y-axis. As seen in FIG. 3D, the measurements 363 taken at a three-hundred Kelvin (300 K) level show the greatest current output, and thus lowest resistivity. Measurements taken at 250 K, 150 K, 100 K, 60 K, 350 K, and 10 K, denoted by numerals 365, 367, 369, 371, 373 and 375, respectively, show increasing resistivity (i.e., lower current) as the temperature decreases. Some embodiments described herein therefore include metal oxides that exhibit non-metallic switching mechanisms.

C. Exemplary Materials.

For the structures discussed above, a wide variety of materials are suitable for use in (a) the semiconductor device layer (e.g., metal oxide layer), (b) one of the electrodes in a MIM stack, or (c) as one or additional layers or structures used with a MIM stack. For example, design considerations may include using more than one metal oxide in a single layer (co-deposition) or multiple layers (stacked), using electrodes that have different work functions, using at least one Noble metal electrode, using different metal oxides having different bandgaps, and using low leakage materials.

1. Metal Oxides (One or More Layers).

Specific base metallic oxides that demonstrate appropriate switching mechanisms include Hafnium Oxide, Vanadium Oxide, Scandium Oxide, Aluminum Oxide, Tantalum Oxide, Zirconium Oxide, and Yttrium Oxide. These metal oxides have a bandgap that is greater than 4 eV, indicating that they are more insulating and therefore have a higher resistivity. As explained above, the use of high bandgap (i.e., greater than 4 eV metal oxides also allow for at least partial scaling of set voltage as related to metal oxide thickness. Generally speaking, the selected metal oxide preferably matches each of the following characteristics: (a) it exhibits bulk-mediated switching; (b) it includes a base metal oxide having a bandgap of greater than four electron volts (eV); (c) it has a set voltage of at least one Volt per hundred Angstroms of thickness; and (d) it has a leakage current density of less than 40 Amps per square centimeter, measured at one-half Volt per twenty Angstroms of thickness while in an "off" state.

These various metals and metal oxides may also be further doped with each other. Other dopants may include Oxygen, Silicon, Silicon Oxide, Nitrogen, Fluorine, Chromium, and Chromium Oxide, as well as rare earth metals such as Lanthanum, Cerium, Praseodymium, Neodymium, Gadolinium, Erbium, Ytterbium, and Lutetium and their oxides, any of which may be used for ion bombardment processes, per the teachings presented above.

Dopants can be selected by considering probable oxidation states with the potential to create defects. For example, Hafnium atoms can have a +4(Hf+4) oxidation state, and Aluminum atoms can have a +3(Al+3) oxidation state. Aluminum Oxide can be doped into Hafnium Oxide, creating charge imbalances by creating substitution defects where Aluminum atoms replace Hafnium atoms (i.e., AlHf1−), and vice versa (i.e., HfAl1+). These defects allow for the formation of percolation paths in the bulk of the metal oxide.

Another criterion for selecting dopants can be the difference between the valence (e.g., for a p-type dopant) or conduction (e.g., for an n-type dopant) band of the dopant and the valence or conduction band of the metal oxide. In some embodiments, a difference between the valence bands that is greater than 50 meV can provide deep-level dopants that can form deeper and more accessible traps in the bulk. Doping and bombardment can be performed using the same metal as the metal oxide into which the dopant is injected. For example, a Hafnium Oxide layer can be doped with Hafnium ions. Doping can be performed using implantation, for example. Implantation energy may generally be in the range of 0.5 keV to 55.0 keV depending on the ion being implanted and the thickness of the metal oxide and the desired vacancy defect generation. This doping can improve memory cell yield. Alternatively, other forms of ions can be used, including non-metal ions such as oxygen.

These layers can also be optionally thermally treated by, for example, rapid thermal anneal ("RTA"), rapid thermal oxidation ("RTO") or a reducing anneal (as will be discussed below). The thermal treatment causes interdiffusion of defect species between the materials, creating localized charge differences which can serve as trap states and, depending upon desired device characteristics, this interdiffusion may or may not be desired. For example, with a semiconductor layer of Hafnium Oxide, it is found that interdiffusion of materials creates unpredictable layer thickness and associated unpredictability of defect distribution, implying it may be desirable to control interdiffusion for some species. Thus, if desired for the particular implementation, a metal oxide can be positioned adjacent to a metal nitride electrode, with a common metal used to form both materials. For example, a memory cell can be formed having a Titanium Nitride electrode and a Titanium Oxide layer adjacent to the Titanium Nitride electrode. The Titanium Oxide layer provides a barrier layer that may serve to stabilize the interface and promote adherence of other layers, for example. Generally speaking, a barrier layer material can be an oxide of the same metal found in the adjacent electrode (or one of the same metals, if multiple metals are used). The memory cell can also include other metal oxides (e.g., Aluminum Oxide or Hafnium Oxide) in a stacked or co-deposited manner.

In still further embodiments, multiple oxides can be combined together in discrete layers to adjust the current flow characteristics of the memory cell. One layer consisting predominantly of a one metal oxide (or one combination of oxide, oxides or metals) can have a smaller "on" current than the second layer formed of a different combination or to have different current flow characteristics.

2. Electrodes.

Electrode materials may include Silicon, silicides, Titanium Nitride (TiN), Nickel, Platinum, Iridium, Iridium Oxide, Ruthenium and Ruthenium Oxide. According to some embodiments, one electrode may be a higher work function material, and the other electrode may be a lower work function material. For example, in one embodiment, at least one electrode is a high work function material such as a Noble or near-Noble metal (i.e., a metal with a low absolute value free energy change ($|\Delta G|$) of oxide formation). Noble or near-Noble metals include Iridium, Iridium Oxide, Platinum, Ruthenium, and Ruthenium Oxide. The other electrode may be a lower work function material such as Titanium Nitride, or may also be a Noble or near-Noble material. In some embodiments, the reset voltage at the electrode having the higher work function may be applied as a positive polarity pulse (i.e., the higher work function electrode is the anode of the memory cell). The electrodes can also be multi-layer electrodes that can include one or more different materials. For example, an electrode can include a layer of Ruthenium and Ruthenium Oxide, or a layer of Iridium, Iridium Oxide, or Platinum with a capping layer of Tungsten, Tungsten Carbonitride, or Tungsten Carbon. The multi-layer electrodes can be used to improve adhesion properties and performance of memory cells in some configurations and embodiments.

3. Other Layers.

The insulator or semiconductor device layer of the MIM stack can also be constructed using multiple layers of oxides. The combination of oxides can be used to impart desired characteristics to memory cells. Other layers may also be used, such as for example, a defect access layer as described herein. Each such layer is optional, and may or may not be pertinent to a particular implementation. As mentioned earlier, the stack may also optionally include another electrical device such as an embedded transistor or diode (referred to below as a "current steering" layer, device or element). The various layers for these memory cells can be deposited using any appropriate technique including dry (CVD, ALD, PVD, PLD, evaporation) and wet (liquid chemical e.g., ELD, ECD) techniques. Combinations of these techniques can also be used. For example, one layer can be deposited using a physical vapor deposition ("PVD") process and another deposited using an atomic layer deposition ("ALD") process.

The operation of memory cells that include multiple metallic oxide layers is generally the same as that described above for a cell having a single metal oxide layer. For example, the set and reset pulses and percolation paths described above apply equally to both single layer metal oxide embodiments and multiple layer metallic oxide embodiments. Generally speaking, oxide stacks can be used to impart desired characteristics to a memory cell. For example, a defect access layer can increase the effective work function of an adjacent electrode, thereby any requirement that the electrode also have a high work function. In some instances, stacking oxides can improve set and reset voltage distribution and also facilitate better memory cell yield.

A defect access layer can be configured as a layer between the one of the electrodes (generally the anode) and the semiconductor device layer. The defect access layer is a thin layer (i.e., 25% as thick as the semiconductor device layer or less) that allows the electrode to better access the defects while in some embodiments reducing currents because of the increased resistivity of the defect access layer. In some embodiments, one electrode has a higher work function than the other electrode; in these embodiments, the defect access layer may be placed adjacent to the high work function electrode. The defect access layer can increase the effective work function of the adjacent electrode, thereby allowing the use of less Noble or non-Noble electrodes. Additionally, depending on the materials chosen, the electrode may show better adhesion to the defect access layer than the metal oxide of the base layer. Therefore, the defect access layer can be used in materials systems as an adherence layer to promote physical integrity of the memory cell. In another embodiment, the defect access layer can be a thin (e.g., less than 50 Å or less than 20 Å) stable oxide such as Aluminum Oxide, to facilitate use of non-Noble electrodes as a higher work function electrode.

To provide a further example of materials that may be used, in one embodiment, Titanium Nitride, Silicon, a silicide, or a Noble metal can be used for one electrode, Hafnium Oxide can be used as the primary constituent of the semiconductor layer, Aluminum Oxide can be used as a doping layer, and a Noble or near-Noble metal such as Platinum, Iridium, Iridium Oxide, Ruthenium, or Ruthenium Oxide can be used for a second electrode. In such a system, additional defects may be created by ion bombardment as described earlier, and interdiffusion or aliovalently doping may also be used to enhance the doping layer. The different oxidation states of the metallic oxide, e.g., Hafnium create traps, which mediates the switching mechanism.

In a second example, the semiconductor layer can be any transition metal oxide having a bandgap of at least 4 eV, a set voltage of greater than 1 V per 100 Å of thickness, and a leakage current density less than 40 Amps/cm2 at 0.5V per 20 Å of metal oxide in the "off" state. Examples include Hafnium Oxide, Aluminum Oxide, Tantalum Oxide, and Zirconium Oxide. The other layers can also be formed from transition metal oxides, such as Titanium Oxide or Niobium Oxide, or from materials that exhibit high resistivity or other desirable characteristics. Some other examples include stacks that blend (a) Titanium Oxide, Hafnium Oxide and Titanium Oxide layers, (b) Hafnium Oxide and yttrium oxide layers, or (c) Yttrium Oxide and Hafnium Oxide layers.

As alluded-to earlier, other electrical components may also be associated with each memory cell. Current steering elements may include, for example, diodes, p-i-n diodes, silicon diodes, silicon p-i-n diodes, transistors, etc. Current steering elements may be connected in series in any suitable location within or adjacent to the memory cell, including in between one of the electrodes and the remainder of a cell or oxide stack, referenced above. Current steering elements may be used to enhance operation or control of memory cells (or other semiconductor structures), depending on the application.

II. Additional Process Considerations

As indicated earlier, some non-volatile memory designs are such that a forming process is used to condition the device, through the use of a voltage or current that is higher than will be used once the device has been conditioned to steady-state use within a system. The use of higher-than-normal voltages presents at least two disadvantages to memory devices, including that (a) it can be difficult or expensive in terms of silicon to generate or support a higher voltage associated with the forming process, and (b) the use of generally higher currents presents a risk of damaging memory cells and causing failure, through electric field damage or other forms of overload.

To establish better control over these voltages, for some materials, it may be desired to use processes that provide yet another element of control over defect generation and distribution, or otherwise to reduce any maximum forming voltage. A number of embodiments are presented below to this end, including (a) a nonvolatile device having a barrier layer, (b) a nonvolatile memory device and related fabrication method that is based on a reducing anneal, and finally, (c) a forming process for a memory device that is based on a reverse polarity forming voltage or upon electronic injection via a lower work function electrode.

FIG. 4 provides a flow chart 401 that helps illustrate a fabrication method for a non-volatile memory array. The method begins preparation of a substrate, on which a first signal line will be deposited, as indicted by numerals 403 and 405. In a typical implementation, the substrate may be composed of silicon and the first signal line can be a conductive metal, for example, Tungsten. An electrode can then be deposited over this first signal line, for example, Titanium Nitride (TiN), as introduced above and represented by function block 407. If desired, steps 405 and 407 may be combined to deposit a single material (e.g., to use the first signal line directly as a cell electrode). A first option may be employed at this point to deposit an optional barrier layer, as represented by step 409.

In this regard, one material that is suitable for use in a ReRAM memory cell as the metal oxide is Hafnium Oxide (HfO2), which unfortunately can be chemically unstable with a certain other materials, among them, Titanium Nitride. Should these materials be used together, diffusion of Hafnium with the Titanium Nitride is sometimes observed, which increases overall semiconductor layer thickness (increasing resistivity) and affects predictability of defects relative to a native Hafnium Oxide layer. The use of a barrier layer to chemically isolate Hafnium from other materials (not chemically compatible with Hafnium) helps minimize defect and thickness variation during and after device fabrication, and thus leads to more predictable results. The type of material used for such a barrier layer preferably is a material that demonstrates chemical, mechanical and thermal compatibility with adjacent layers and with the memory array as a whole; in the case of Hafnium Oxide and Titanium Nitride, a suitable barrier layer meeting these requirements may be a thin transition metal oxide layer, for example, Titanium Oxide (TiO2). The barrier layer is ideally chosen so as to have a sufficient thickness to provide interdiffusion barrier characteristics. In embodiments where it is desired to have a separate metal oxide primarily determine bulk switching characteristics of a bistable device, the barrier layer is chosen to be thin enough that it does not substantially affect cell resistance characteristics that would be expected for an undiffused layer or layers of the native metal oxide (e.g., HfO2). In embodiments discussed below, it is expected that a suitable barrier layer of Titanium Oxide may be approximately 50-75 Angstroms in thickness (e.g., for a semiconductor layer on the order of 150-200 Angstroms thick, i.e., the barrier layer can be chosen to be no more than approximately half of the thickness of the semiconductor layer). It is possible to make the barrier layer even thinner, and suitable results may be obtained with a barrier layer as thin as 5-10 Angstroms. Thus, at least some device embodiments may benefit from the presence of a barrier layer to effectively reduce forming voltage. Other materials may be used beyond those discussed above to achieve a similar effect, e.g., another transition metal oxide. Generally speaking, semiconductor layer materials having a bandgap of at least four electron volts may present the need for a barrier layer, and a suitable barrier layer that isolates an electrode of a specific material or substance from the semiconductor layer will also include the specific material or substance. The substance can be any element (e.g., a metal or non-metal) or compound, for example polycrystalline Si or Ti. In some embodiments, the material or substance may be a specific metal and the barrier layer can include an oxide of that specific metal. Thus, for example, in a situation where a TiN electrode is used, a barrier layer of TiO2 should produce suitable results.

Irrespective of whether a barrier layer is used, a semiconductor layer is fabricated to lie above the first electrode and any associated signal line, as indicated by numeral 411. This semiconductor layer may be formed of a wide variety of different materials, for example, Hafnium Oxide as mentioned above, or any other of a wide varieties of materials discussed in the sections above, e.g., Titanium Oxide, Yttrium Oxide, Niobium Oxide, Aluminum Oxide, Tantalum Oxide, combinations of these materials, or other doped or undoped materials. If it is desired to use high bandgap materials (i.e., having a bandgap of at least 4 eV, then oxides of Hafnium, Aluminum may present appropriate choices. Three process boxes 413, 415 and 417 indicated at the left of FIG. 4 show a set of options that may be used for the fabrication process. For example, per block 413, a metal or metal oxide may be sputtered to deposit the semiconductor layer; if desired, a metal such as Titanium or Yttrium may be sputtered in a reactive environment (e.g., with O2 or another source of Oxygen present within a deposition chamber) to deposit layers having an amorphous, crystalline or other structure, as desired. As indicated by block 415, an atomic layer deposition ("ALD") process can also be used to provide a similar reactive environment, e.g., in a chamber with precursors that provide an oxygen source. Other processes can also be used, including chemical evaporation, or other forms of physical or chemical deposition processes, per numeral 417.

As mentioned earlier and as with any layer discussed in this disclosure, there are a variety of optional layers that can be used and deposited in various orders to achieve specific design goals. Numeral 419 represents deposition of optional layers above the semiconductor layer, for example, to serve as a smoothing, adherence, defect access, barrier, current steering element, or other form of device or layer. While shown between the semiconductor layer and a top electrode to provide an example, these optional layers may be omitted, used in several places, or in any order or combination amenable with overall design goals.

Once the base layers have all been deposited, each memory cell "stack" can be finished with a top electrode, top signal line and encapsulation layers, as represented by numerals 421, 423 and 425 in FIG. 4.

Whether or not a barrier layer or Hafnium Oxide are used, defects may also be reduced or regulated through the use of an anneal process. However, not all anneal processes necessarily reduce defects or facilitate more predictable structures. Where a metal oxide is used as the semiconductor layer, depending on materials, predictability can be enhanced through the use of a reducing anneal, that is, one that removes excess oxygen. Numeral 427 therefore indicates an anneal process conducted in the absence of an oxygen source, e.g., a reducing anneal. Embodiments will be presented below which therefore rely on an anneal in a vacuum, and an anneal in the presence of a reducing agent, e.g., hydrogen source that does not also provide an oxygen source (for example, using gaseous ammonia NH3 or forming gas). It is believe that such an anneal may yield benefits to a wide variety of structures that do not necessarily rely on Hafnium Oxide or a barrier layer, as discussed above, and that such an anneal may facilitate greater device predictability and lower forming voltage (if any).

Finally, whether or not a barrier layer, Hafnium Oxide or special anneal process is used, a method step of a negative forming pulse may also help minimize the maximum voltage required by a forming process, as indicated by numeral 429. That is to say, a device is first typically set and then reset. By applying a voltage pulse (i.e., current flow) that is opposite in polarity to a set voltage pulse to initially set a device, it has been found that a lower overall forming current may be generated, thereby helping reduce the potential for device failure (cell failure) from applying too much current or generating excessive electric fields. In embodiments where higher and lower work function electrodes are used (e.g., Platinum and Titanium Nitride), this "counter current" pulse can rely on electron injection into the structure from the lower work function electrode.

Typically, circuit space is at a premium, and typical system implementations do not provide the charge structures necessary to inherently generate opposite direction current flows usable for generating a negative forming voltage pulse. Therefore, specific embodiments will be presented below (in connection with FIGS. 10 and 11) that respectively use (a) control logic that either under manual control at manufacture or using programmatic control, permits switching of voltage couplings so as to permit electrodes to effectively "trade places" to apply a counter current, and (b) a fusible link to permit pins to serve double-duty, for use in applying forming voltages in the manufacturing process. These embodiments may be advantageous to some designs, because they do not require additional voltage distribution or high voltage generation circuitry, but can use the same circuits used for steady state voltage operation.

Figure 5:
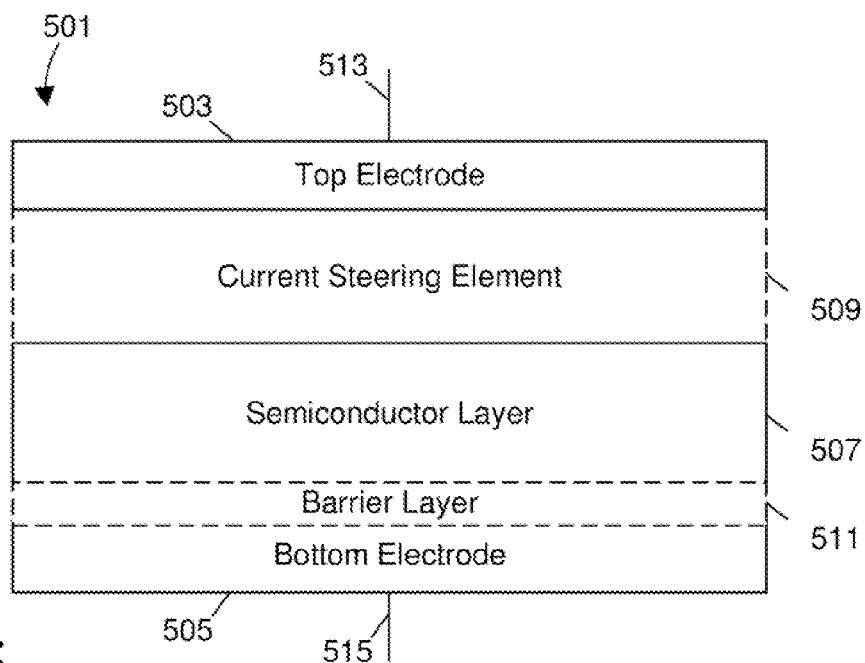
FIG. 5 illustrates a memory cell 501 using a stacked oxide system according to various embodiments. The cell includes the two electrodes 503 and 505, as well as a semiconductor layer 507. The semiconductor layer may be a transition metal oxide with a bandgap greater than 4 eV such as Hafnium Oxide, Aluminum Oxide, Tantalum Oxide or other materials, fabricated according to the processes described herein. As will be described further below, a barrier layer 511 may be used to provide chemical isolation between the semiconductor layer and an adjacent material, such as an electrode.

FIG. 5 illustrates a memory cell 501 using a stacked oxide system according to various embodiments. The cell includes the two electrodes 503 and 505, as well as a semiconductor layer 507. The semiconductor layer may be a transition metal oxide with a bandgap greater than 4 eV such as Hafnium Oxide, Aluminum Oxide, Tantalum Oxide or other materials, fabricated according to the processes described herein. In some embodiments, a current steering element 509 may also be used, for example, a diode or transistor, to help regulate cell operation and, if desired, a barrier layer 511 may optionally be used. Each of the current steering element 509 and the barrier layer 511 are indicated in phantom lines, to indicate their optional nature. Signal lines 513 and 515 are respectively coupled to each electrode, so as to apply the forming, set, reset and read voltage pulses that are used to condition and operate the cell. Notably, although each layer is illustrated with a different thickness, it should be understood that these thicknesses are illustrative only, and are not intended to provide examples of absolute or relative thickness.

Figure 6:
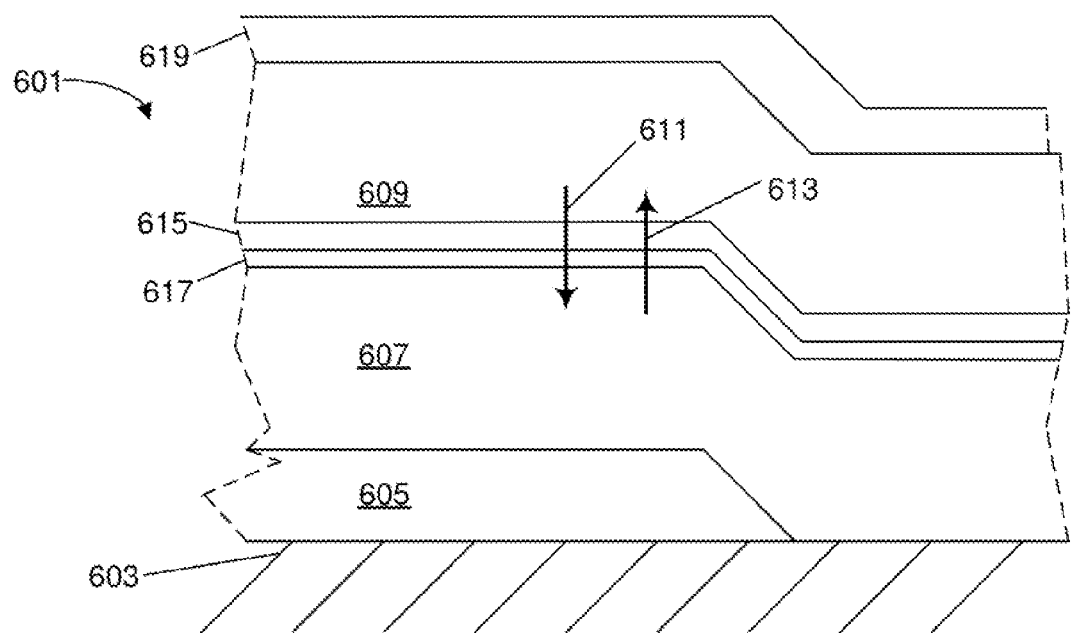
FIG. 6 is a cross section of a single memory cell 601 above a substrate 603. The FIG. is used to explain the use of (unipolar or bipolar) current flows for setting and resetting the memory cell. A barrier layer 617 may be used to chemically isolate a metal oxide layer 615 from an adjacent electrode 607; in the referenced example, a Titanium Oxide barrier layer may be used to mitigate chemical incompatibility between a Hafnium Oxide semiconductor layer 615 and a Titanium Oxide bottom electrode 605.

FIG. 6 provides more detail on the structure of an illustrative ReRAM cell 601. In particular, the cell consists of a number of layers deposited or otherwise fabricated above a substrate 603. The substrate may be made of Silicon, with a signal line 605 (e.g., Tungsten) deposited to help form a grid, used to discriminate between memory cells and to form, set, reset and read each memory cell. [The signal line should be assumed in this figure to extend into and out of the page, and to access many memory cells in parallel.] For the illustrated memory cell, a first electrode 607 is deposited on this signal line, and can include any suitable electrode materials including those mentioned earlier in this disclosure. In the illustrated example, the electrode can include Titanium Nitride and may be on the order of a few hundred to a thousand Angstroms thick. The first electrode 607 will cooperate with a second electrode 609 to operate the cell through currents that flow between the electrodes based on electrode voltage differences; numerals 611 and 613 illustrate two opposite directions of current flow, e.g., to set and reset the cell (or to apply a forming voltage pulse and set voltage pulse, respectively). These currents flow across a semiconductor layer 615, which may be a metal oxide as has been described earlier. For example, this layer 615 may be formed of Hafnium Oxide of a thickness of approximately 150 Angstroms; in the event a metal oxide is used that has materials that are chemically, structurally or thermally incompatible with other layers, a barrier layer 617 may also be used. In the case of Hafnium Oxide, a material may be used which provides a barrier between Hafnium Oxide and another material (such as Titanium Nitride) to mitigate the effects of chemical interdiffusion (i.e., or other forms of chemical incompatibility). Such a layer may in this example be approximately one-fifth to one-half the thickness of the semiconductor or metal oxide layer, e.g., 75 Angstroms or less for the illustrated example. Finally, the cell terminates with the top electrode 609 and a second signal line 619 and an encapsulation layer (not separately illustrated in FIG. 6). The top electrode in this example can be a high work function metal, such as Platinum or another Noble or near-Noble metal, and is generally approximately the same thickness as the first or bottom electrode 607, e.g., 800 Angstroms in thickness. In one embodiment, the top electrode can be made from polysilicon (poly-Si or p-poly-Si, both high work function, non-noble electrodes), such that the cell can be fabricated as a PolySi/HfOx/TiOx/TiN or p-PolySi/HfOx/TiOx/TiN stack. If desired, a defect access layer (as described above) may also be used to increase the work function of an adjacent electrode.

The semiconductor layer 611 can use a bulk-mediated switching mechanism as described above. In one embodiment, the bottom electrode 607 is grounded and voltage pulses are applied to the top electrode 609 (i.e., either positive or negative pulses, depending on voltage generation circuitry design). In a unipolar embodiment, for example, the applied set and reset pulses can be both negative, meaning that a negative DC voltage is applied to the top electrode. Extending this example to a bipolar embodiment, the set pulse can be positive while the reset pulse can be negative. Alternatively, logic can be used to reverse the potentials to effectively reverse polarity, i.e., each electrode can be driven by a tristate control that can alternatively couple each electrode to ground or to a positive voltage—thus, the top electrode 607 can be grounded and positive pulses applied to the bottom electrode 609 to generate a negative pulse (i.e., a negative current flow in the direction of arrow 613). In an alternative embodiment, for unipolar switching, positive pulses (i.e., in the direction of arrow 611) can be used for both set and reset pulses.

The electrode that is positive for the reset voltage pulse is described herein as the anode, while the other electrode is the cathode. The anode is positive for reset, and may be positive for the set (for unipolar embodiments) and negative for the reset (for bipolar embodiments). Generally, the set and reset voltages may be used to apply a current flow through the semiconductor layer that either has a same relative polarity (unipolar) or a different relative polarity (bipolar). Percolation paths responsible for conduction are believed to originate from the anode and spread toward the cathode. Thus, if a positive potential is applied to the top electrode 607 as the anode, percolation paths originate from the cathode and, as traps are filled, migrate toward the anode in the presence of the set voltage pulse. The reset pulse subsequently destroys the percolation paths. In some embodiments, oxygen (O2-) defects may be the mobile species that lead to the formation of the percolation paths.

Figure 7:
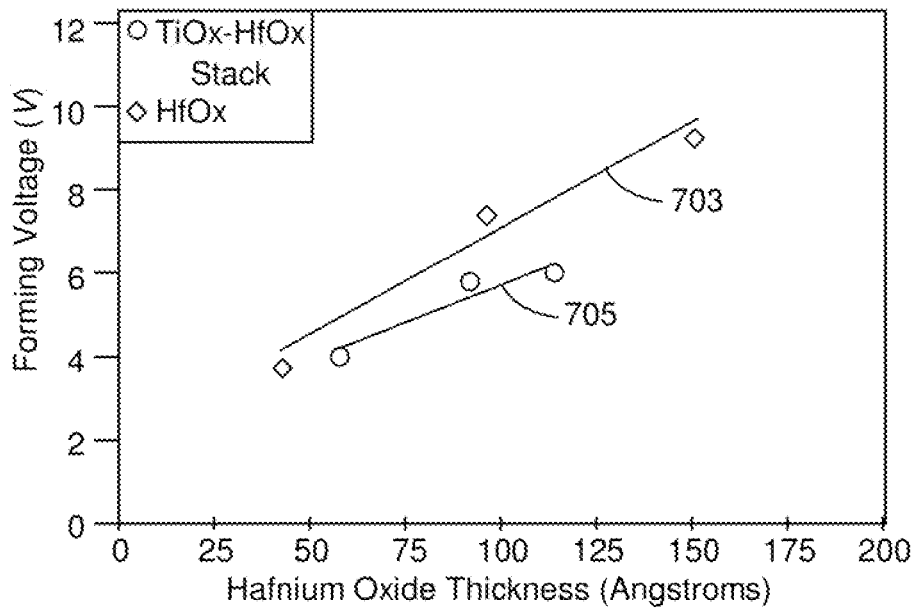
FIG. 7 provides a graph 701 that compares (a) a forming voltage curve 703 for memory cells that do not have a barrier layer, with (b) a forming voltage curve 705 for memory cells that do have a barrier layer.

FIG. 7 provides a graph 701 that compares (a) a forming voltage curve 703 for memory cells that do not have a barrier layer, with (b) a forming voltage curve 705 for memory cells that do have a barrier layer. As indicated above, by modifying the interface between the semiconductor layer (e.g., Hafnium Oxide) and an adjacent layer (e.g., the bottom electrode, for example, Titanium Nitride), a lower forming voltage may be obtained. That is to say, a memory cell stack composed of Titanium Nitride, Titanium Oxide, Hafnium Oxide and Platinum oxide shows lower forming voltage compared to stacks lacking a Titanium Oxide barrier layer. Alternative barrier layer materials may also be used, e.g., where Hafnium Oxide is used as the semiconductor layer, nearly any material that improves upon chemical stability of the interface between a memory element and its adjacent layer or layers; as mentioned, the barrier layer materials are also preferably mechanically and thermally stable with the adjacent layers as well. In the example of FIG. 7, the electric field generated during the forming process where the barrier layer is used is seen to be 4.6 V/cm of metal oxide layer thickness, as compared to 5.6 MV/cm for where no barrier layer is used.

Figure 8:
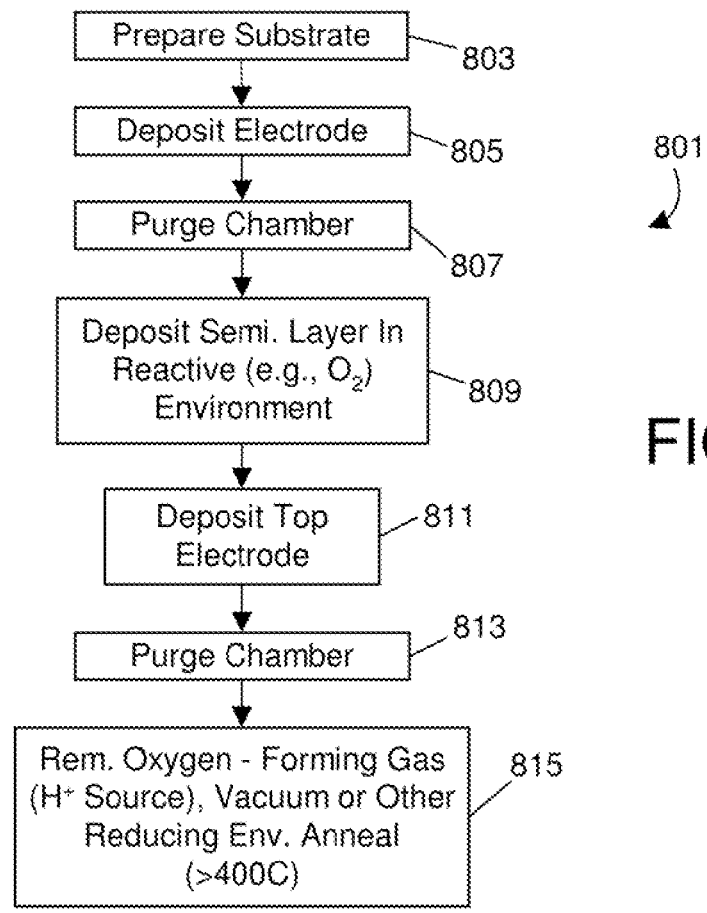
FIG. 8 is a flow chart used to provide additional detail on a fabrication method where a reducing anneal process is applied to the memory device (that is, an anneal either in the presence of a vacuum less than 1 milliTorr or in the presence of a reducing agent).

As indicated above, a reducing anneal may also be used to provide greater consistency in defect distribution within fabricated memory cells. FIG. 8 is used to provide additional detail on a fabrication method where a reducing anneal process is applied to the memory device.

As indicated by the flow chart 801 of FIG. 8, the substrate is first prepared, with a signal line and, if appropriate, a bottom electrode being deposited. A semiconductor layer such as a metal oxide is then deposited over these layers and any intervening layers (e.g., such as a barrier layer, current steering element, defect access layer, smoothing layer, etc., if employed in the particular design). As was alluded to earlier, a number of conventional deposition processes may be used to fabricate the semiconductor layer, but in connection with FIG. 8, it should be assumed that a reactive process is used that creates a metal oxide in a vacuum chamber, during the deposition process; it has been found that such a process may give better results in terms of desired defect properties, and a reactive sputtering or reactive atomic layer deposition ("ALD") process may be used for these purposes. Accordingly, the vacuum chamber can be purged before the fabrication of the semiconductor layer, to facilitate a reactive environment. Once this process is finished, a top electrode can be deposited over the entire assembly (as well as any intervening layers, if appropriate to the design). These steps are respectively indicated by numerals 805, 807, 809 and 811. To prepare the assembly for a reducing anneal, the chamber is then purged, for example, to remove any oxygen that may be left over from the deposition process, and the anneal can then be performed, per numerals 813 and 815.

The anneal may be performed in any environment which has the effect of removing oxygen from a deposited semiconductor layer; for example, the anneal may be performed in a relative vacuum (i.e., less than 1 milliTorr pressure), or may be performed in an environment that removes Oxygen through chemical combination or substitution with other atoms (i.e., through the presence of a reducing agent). Annealing in Ar/H2, N2/H2, He/H2 or other mixtures containing an inert gas and some amount (e.g., 0.5 volume percent or more) Hydrogen or Ammonia (NH3) can result in lower forming voltages. Without being bound by theory, anneals of these type may help fill some defects (e.g., traps) in the semiconductor layer, requiring less voltage to fill the remaining defects and change the resistance state of the memory element. The anneal may also facilitate greater consistency in the distribution of defects.

The anneal can be performed in a standard vacuum furnace at temperatures of 4000 Celsius or greater, with pressures of less than or equal to 100 milliTorr. Flowing a forming gas or one of the other gasses mentioned above can be used to provide sub-ambient pressure for the anneal and a reducing environment. If a vacuum is to be applied without flowing gas, the anneal can also be performed at very low pressures such as 1 milliTorr or less to also provide a reducing environment.

Figure 9:
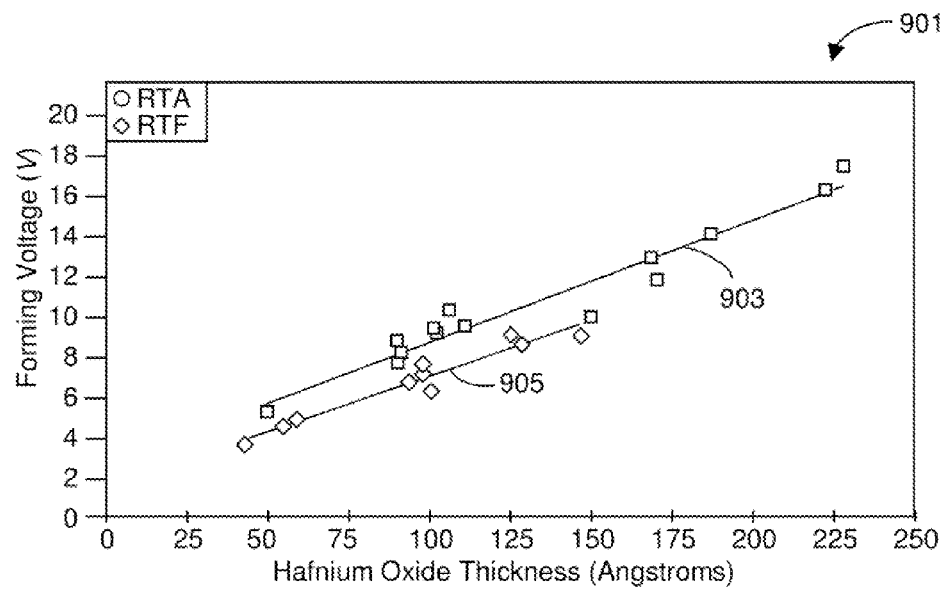
FIG. 9 provides a graph 901 of forming voltage versus metal oxide thickness for memory elements prepared using a rapid thermal anneal 903 ("RTA") and a forming gas anneal 905 ("RTF").

FIG. 9 provides a graph 901 of forming voltage versus metal oxide thickness for memory elements prepared using a rapid thermal anneal 903 ("RTA") and a forming gas anneal 905 ("RTF"). As can be seen, the memory cells prepared using the forming gas anneal show a lower forming voltage than those prepared using the rapid thermal anneal. Additionally, the electric field corresponding to the forming voltage for the forming gas anneal is 5.6 MV/cm of metal oxide thickness as compared to 6.2 MV/cm for a rapid thermal anneal in an Argon environment.

As indicated earlier, the potentially harmful effects of excess forming voltage may also be mitigated through the use of a forming voltage pulse of opposite polarity, that is, that provides a current flow opposite to the current flow used for the set pulse that would be used for a conditioned memory device. The forming event is typically the first set operation of the memory element, and therefore has the same polarity as the set operation. That is to say, contrary to conventional wisdom, a pulse opposite to that normally used to set a memory cell is applied via the forming process to set the cell for the very first time. The process of applying this pulse is identified by FIG. 4 and two designs that can make use of this pulse are respectively indicated by FIGS. 10 and 11.

Figure 10:
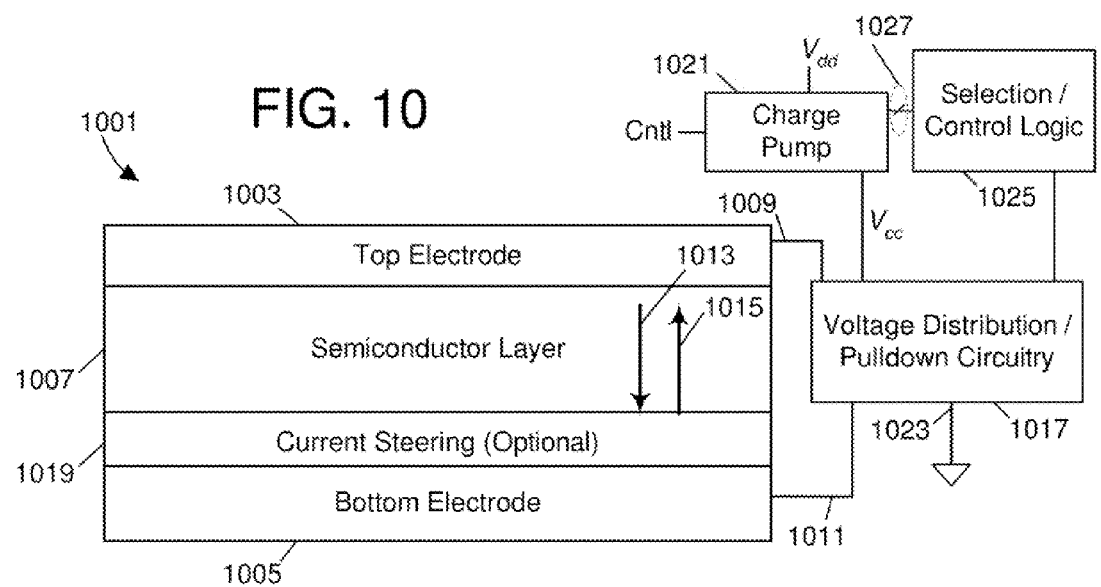
FIG. 10 shows distribution circuitry that is used to apply pulses of opposite polarity across a memory cell, that is, in a selective manner represented by the relative direction of by arrows 1013 and 1015. More particularly, FIG. 10 provides an embodiment where selection and control logic 1025 may be used to control the polarity and application of a forming voltage pulse.

FIG. 10 depicts a memory cell 1001 having a top electrode 1003, a bottom electrode 1005 and a semiconductor layer 1007 sandwiched therebetween. The memory cell is preferably formed using combinations of materials introduced earlier and may, depending on design, have additional current steering elements, barrier layers, defect access layers, or other elements, introduced earlier. It should also be assumed that a memory device represented by FIG. 10 includes a great many such memory cells 1001, arranged in an array, although only one such cell is depicted here for convenience in explaining the manner of operation. Each cell will be served by two signal lines 1009 and 1011 used to operate the cell, e.g., set, reset, form, and read the cell.

In the embodiment of FIG. 10, it should be assumed that it is desired to apply pulses of opposite polarity across the cell, that is, in a selective manner represented by the relative direction of by arrows 1013 and 1015. In this regard, each electrode is coupled to voltage distribution/pulldown circuitry 1017 which is used to selectively couple each electrode either to a specific voltage Vdd or to ground. While both electrodes are depicted as coupled to the same circuitry 1017, it should be appreciated that this circuitry may be configured as one circuit dedicated to a cell, to a group of cells, or as two separate circuits for respective connection to a different one of the electrodes for each cell or group of cells. In this regard, the primary function of the voltage distribution/pulldown circuitry is to toggle the polarity of voltage applied across the cell. In one embodiment, for example, cells corresponding to a group of cells (for example, a set of cells such as a word, column, row, page, block or other configuration) might be first reset as a group with programming accomplished by setting select cells in the group to cause the group to assume the desired logic state. This embodiment may be structured such that only one polarity will be applied to the entire group of cells at a time, and thus, the voltage distribution/pulldown circuitry 1017 can be relied upon to provide the correct polarity and magnitude of voltage pulse, with a current steering element 1019 or other control being used to trigger the application of this pulse to individual cells (i.e., for setting of selective cells). The voltage distribution/pulldown circuitry may be in this case effectively modeled as providing a tristate device for each associated signal line, i.e., such that the signal lines can be switched in tandem to provide a voltage difference of either polarity. Many other configurations are possible, including configurations that apply multiple voltages that operate on individual cells or rows in a sequentially-addressed manner, or another configuration. As indicated by numeral 1021, the voltage provided to each cell may be increased from a device reference voltage (Vdd) through the use of a charge pump or other circuit appropriate to the embodiment, with a ground connection being provided by a current return path 1023. Determining whether to apply set or reset pulses, selecting the appropriate cell or group of cells, determining the appropriate voltage (in some embodiments) and timing pulse application pulses is the function of a selection and control logic circuit 1025.

The structure just indicated may also be used to apply a forming pulse having the opposite polarity of a set pulse. That is to say, because the structure depicted by FIG. 10 permits coupling of a voltage reference (Ground or Vdd) to either electrode, a top-electrode-to-bottom-electrode voltage difference can be generated of either +Vdd or −Vdd, as desired, and a pulse of one polarity may be used for a set pulse, while a pulse of the opposite polarity may be used as part of the forming process. Because the circuit includes a charge pump, the selection and control logic can provide programmatic control over the application of forming process pulse by essentially scaling the charge pump as needed using a digital control signal 1027. Thus, the embodiment presented by FIG. 10 lends itself to software control over the forming pulse and, thus, this element of the process (element 429 from FIG. 4) may be applied at the factory (e.g., via a testing device) at system integration and testing, at system initialization, or even at runtime.

As noted above, this embodiment may be used to inject electrons from a lower work function electrode into the switching material as part of the forming process if such an electrode is built into the memory cells. For example, if the bottom electrode 1005 is a lower work function electrode, the selection/control logic circuit 1025 may be controlled to apply one or more voltage pulses as part of the forming process in order to inject electrons into the memory cells via this electrode.

Figure 11:
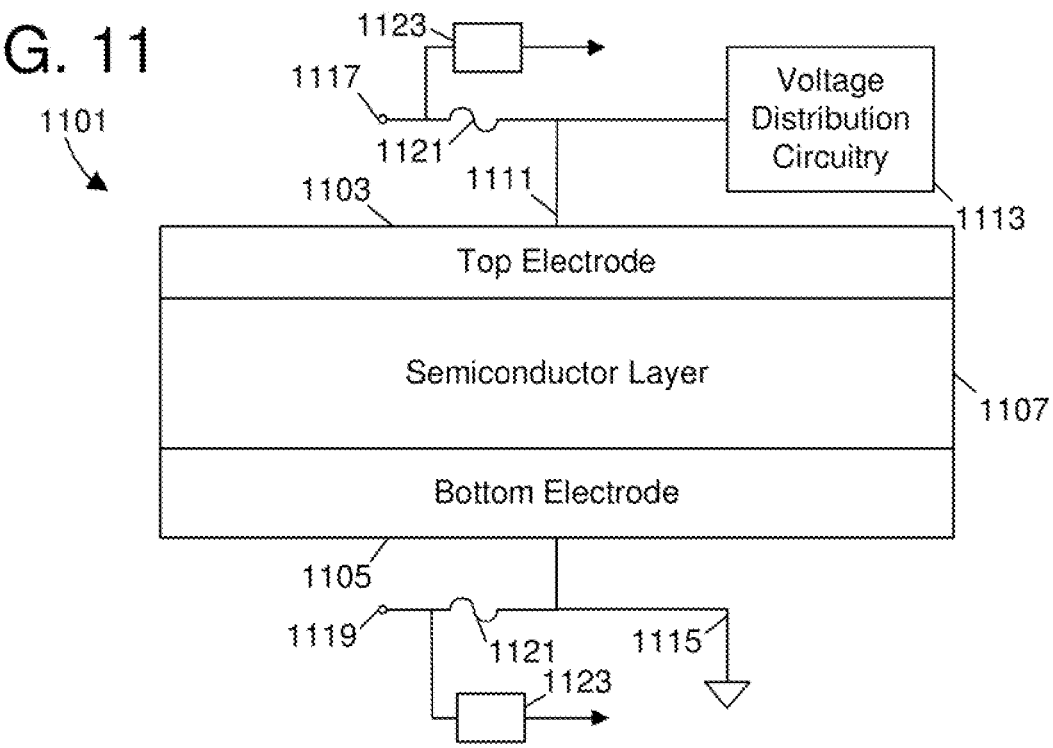
FIG. 11 presents another embodiment of a structure for a memory device 1101 that permits the application of a forming voltage pulse of negative polarity (relative to set pulse); in this embodiment, two voltage supply nodes 1117 and 1119 may be used to inject a voltage pulse. These nodes may be coupled to integrated circuit device IO pins (not shown in FIG. 11) such that the forming voltage pulse may be supplied by an external testing device (also not shown).

FIG. 11 presents another embodiment 1101 that permits the application of a forming voltage pulse of desired polarity. As with the previous example, FIG. 11 also depicts a cell having two electrodes and a semiconductor layer, a first signal line, voltage distribution circuitry and a ground connection, all respectively numbered 1103, 1105, 1107, 1111, 1113 and 1115. However, in this embodiment, the voltage distribution circuitry is depicted as always connected to the top electrode, whereas the bottom electrode is always coupled to ground to provide a return path. In this embodiment, the voltage distribution is such that, during run time, voltage pulses of a single polarity only will be applied. To apply a forming voltage pulse of opposite polarity, the system includes two voltage supply nodes 1117 and 1119 across which a voltage pulse may be supplied by an external device. For example, nodes 1117 and 1119 may be connected to special IO pins. Because pin space is often at a premium, however, it may be desired to use pins for the forming process at manufacture where those pins might be dedicated to a different usage after systems integration. To this end, two fusible links are depicted, each numbered 1121, which may be burned or programmed to disable their use, to essentially decouple nodes 1117 and 1119 from the memory cell terminals prior to runtime operation. These pins may then, during runtime operation, be applied to a different purpose, represented by two blocks each designated by reference numeral 1123. For example, a pin corresponding to node 1117 could potentially be used as a ground terminal, while a pin corresponding to node 1119 could be used as a terminal to apply a device reference voltage Vdd during runtime operation. The embodiment depicted in FIG. 11 may be advantageous where it is desired to apply a voltage pulse as part of a forming process without adding special circuitry to generate a reverse direction current flow.

Thus, according to some embodiments, the polarity of the forming voltage affects the magnitude of the forming voltage. For example, in some embodiments, the anode (e.g., a higher work function electrode relative to the cathode, such as the Platinum electrode used in examples presented above) receives a positive polarity relative to the cathode (i.e., the lower work function electrode).

Figure 12:
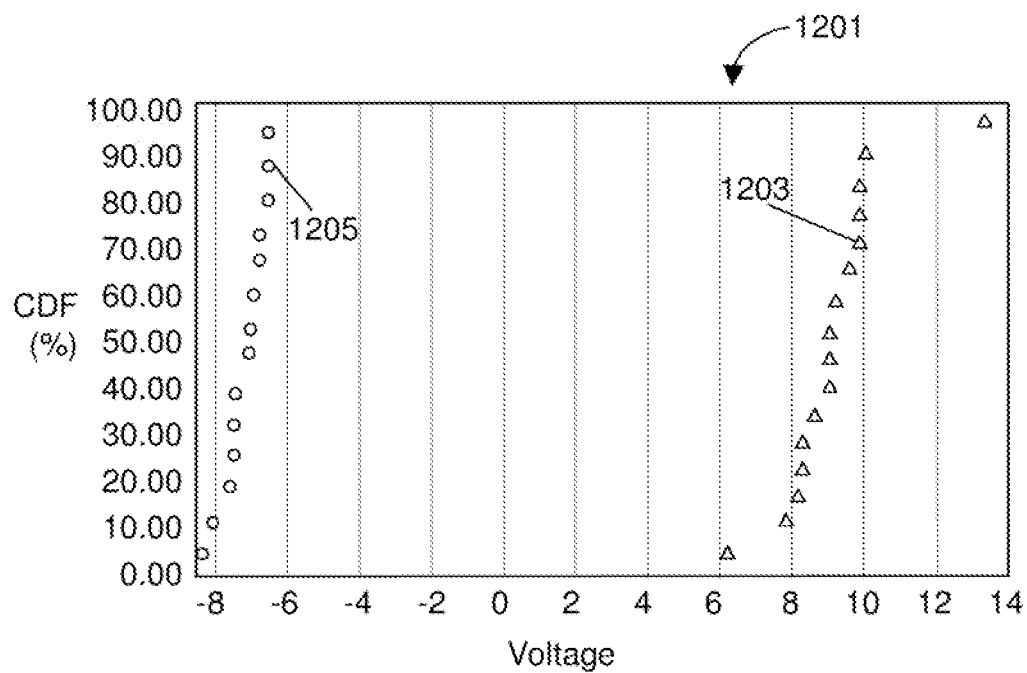
FIG. 12 is a cumulative distribution graph 1201 showing the effects of forming voltages using different polarities. A first plot 1205 shows the effects of a voltage pulse having the same polarity as a set pulse (e.g., with electron injection occurring via the anode), whereas a second plot 1207 shows the effects of a voltage pulse using a pulse applied to inject electrons into the cell via the cathode. The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

The advantages of a reverse polarity forming voltage are represented by FIG. 12. FIG. 12 is a cumulative distribution graph 1201 showing forming voltages using different polarities. A first plot 1205 shows forming voltages for memory cells formed using a voltage pulse having the same polarity as a set pulse (i.e., applied to the anode), whereas a second plot 1207 shows forming voltages for memory elements using an opposite polarity current. The memory cells tested include a one-thousand Angstrom Titanium Nitride electrode, a thirty-seven Angstrom Titanium Oxide barrier layer, a one-hundred twelve Angstrom Hafnium Oxide semiconductor layer, and a two-hundred Angstrom Platinum top electrode. As shown in the graph 1201, the magnitude of the forming voltage is lower (approximately 7.2V) when opposite polarity is applied to the cathode than when positive relative polarity is applied (approximately 9.4V). Without being bound by theory, it is believed that electrons injected from the lower work function electrode (e.g., the cathode) would see a lower interface potential barrier than from the higher work function electrode, and thus, an initial "set" may be obtained with less current and less electromagnetic field if the lower work function electrode is used for electron injection.

Through the use of processes to obtain better control over the defects, it is believe that the setting and resetting of memory cells, particularly ReRAM cells, may be made more predictable. In addition, the requirement of a forming voltage for some designs and applications may be reduced, and thereby minimize the damage potentially caused to memory cells by electromagnetic fields and large currents.

III. Conclusion

A method of fabricating a semiconductor device layer and associated memory cell structures have been described above, each usable with a wide variety of material options. More specifically, the embodiments presented above provide (a) a nonvolatile device having a barrier layer, (b) a nonvolatile memory device and related fabrication method that is based on a reducing anneal, and (c) a forming process for a memory device that is based on a reverse polarity forming voltage or a process that injects electrons via a lower work function electrode. Some or all of these embodiments facilitate a reduced forming voltage, meaning that the teachings presented by this disclosure may promote greater device reliability by minimizing forming process damage. The teachings presented represented by these embodiments may be extended to other devices, methods and systems.

Embodiments presented above have referenced specific materials and interrelationships between layers, including metallic oxides such as Niobium Oxide, Hafnium Oxide, Titanium Oxide, Aluminum Oxide and Tantalum Oxide. However, as mentioned, these materials and interrelationships are exemplary only and, as mentioned, a wide variety of materials may be used in place of the mentioned species, as no doubt will occur to those having skill in semiconductor fabrication or materials engineering.

One embodiment of the teachings presented above is a method of fabricating a memory cell, comprising: forming a first electrode atop a substrate; forming a semiconductor material to lie above the first electrode; forming a second electrode to lie above the second electrode; and annealing at least the substrate, the first electrode, the semiconductor material and the second electrode in a reducing environment. In more detailed features, this reducing environment may include one of (a) an atmospheric pressure of less than approximately one milliTorr, or (b) a gaseous reducing agent and an atmospheric pressure of less than approximately one hundred milliTorr. The gaseous reducing agent may, if desired, be a Hydrogen source or a forming gas (e.g., Hydrogen mixed with either Argon or a Nitrogen gas, such as by way of example, Ammonia). In yet another embodiment, the method can further comprise forming a barrier layer between one of the first electrode or the second electrode and the semiconductor material; the barrier layer can include a transition metal oxide such as Titanium Oxide and be formed between layers of Titanium Nitride (e.g., used as one electrode) and a layer of Hafnium Oxide (as a semiconductor layer material, or another material having a bandgap of 4 eV or greater). The barrier layer is selected to be a material that is chemically compatible with the semiconductor layer materials and an abutting electrode, e.g., Titanium Nitride, and may be formed of an oxide of the metal representing the bulk of the abutting electrode. In still other versions, either the first electrode or the second electrode can be made from Platinum, or another high work function material. If appropriate to the design, the method can be used to form a memory cell array in the form of an integrated circuit device, where the device includes voltage regulation circuitry that can apply a set pulse to each memory cell in the array; a forming process can be used to condition the array, by application of a voltage pulse to each memory cell in the array of opposite polarity to the common polarity. In a more detailed version of this implementation, the voltage regulation circuitry is adapted to apply the set pulse and the reset pulse to the one electrode while the other electrode is coupled to a voltage return path, whereas the forming process is configured to apply a voltage pulse to the other electrode, while the one electrode is coupled to a voltage return path. Any of the memory cells discussed above can be built as a resistive-switching memory cell.

Another embodiment of the teachings presented above is an apparatus having a memory cell, where the apparatus comprises: a first electrode atop a substrate; a semiconductor material to lie above the first electrode; and a second electrode to lie above the second electrode; where the memory cell has been at least partially fabricated using a reducing anneal. This apparatus can be made to have similar variations to the embodiment discussed just above, e.g., to have similar materials, layers or capabilities, built if desired using a similar anneal process to that discussed above, or conditioned using a similar forming process to that discussed above, or both.

Yet another embodiment of the teachings presented above is a method of fabricating a memory cell, comprising: forming a first electrode atop a substrate; forming a semiconductor material to lie above the first electrode; and forming a second electrode to lie above the second electrode; forming voltage distribution circuitry coupled to one of the first electrode or the second electrode, the voltage distribution circuitry adapted to set the memory cell using a first voltage difference; where the memory cell is subject to a forming process in which a second voltage difference is applied to the first and second electrodes, the second voltage difference having a polarity opposite to that of the first voltage difference. In a more detailed version, this method can also include annealing at least the substrate, the first electrode, the semiconductor material and the second electrode in a reducing environment. The reducing environment may include one of (a) an atmospheric pressure of less than approximately one milliTorr, or (b) a gaseous reducing agent and an atmospheric pressure of less than approximately one hundred milliTorr. The gaseous reducing agent may, if desired, be a Hydrogen source or a forming gas (e.g., Hydrogen mixed with either Argon or a Nitrogen gas, such as by way of example, Ammonia). In a still more detailed version of this embodiment, the method can further comprise forming a barrier layer between one of the first electrode or the second electrode and the semiconductor material; the barrier layer can include a transition metal oxide such as Titanium Oxide and be formed between layers of Titanium Nitride (e.g., used as one electrode) and a layer of Hafnium Oxide (as a semiconductor layer material, or another material having a bandgap of at least 4 eV). The barrier layer is selected to be a material that is chemically compatible with the semiconductor material and an abutting electrode, e.g., Titanium Nitride, and can be made of an oxide of the same metal that forms the bulk of the abutting electrode. In other versions of this embodiment, either the first electrode or the second electrode can be made from Platinum, or another high work function material. In still another implementation, the voltage regulation circuitry can be adapted to apply a set pulse to the one electrode while the other electrode is coupled to a voltage return path, whereas the forming process is configured to apply a voltage pulse to the other electrode, while the one electrode is coupled to a voltage return path. Any of the memory cells discussed above can be built as a resistive-switching memory cell.

Another embodiment of the teachings presented above is an apparatus having a memory cell, where the apparatus comprises: a first electrode atop a substrate; a semiconductor material to lie above the first electrode; and a second electrode to lie above the second electrode; and voltage distribution circuitry coupled to one of the first electrode or the second electrode, the voltage distribution circuitry adapted to set the memory cell using a first voltage difference; where the memory cell is subject to a forming process in which a second voltage difference is applied to the first and second electrodes, the second voltage difference having a polarity opposite to that of the first voltage difference.

Still another embodiment of the teachings presented above is an apparatus having a memory cell, where the apparatus comprises: a first electrode atop a substrate; a semiconductor material to lie above the first electrode; and a second electrode to lie above the second electrode; wherein, one of the electrodes has a higher work function than the other electrode; and voltage distribution circuitry adapted to apply a forming pulse that with electrons being injected into the cell from the electrode with the lower work function. Related methods associated with the application of this pulse are also described and, as with the other embodiments just described, this method and apparatus can be made to have similar variations to the embodiment discussed just above, e.g., to have similar materials, layers or capabilities, built if desired using a similar barrier layer element, anneal process, and so forth.

Accordingly, the foregoing discussion is intended to be illustrative only; other designs, uses, alternatives, modifications and improvements will also occur to those having skill in the art which are nonetheless within the spirit and scope of the present disclosure, which is limited and defined only by the following claims and equivalents thereto.

What is claimed is:

1. A memory cell comprising:
   a first conductive layer operable as an electrode;
   a second conductive layer operable as an electrode;
   a semiconductor layer between the first conductive layer and the second conductive layer;
      wherein the semiconductor layer comprises a first sub-layer, a second sub-layer, and a third sub-layer such that the second sub-layer is disposed between the first sub-layer and the third sub-layer;
      wherein the first sub-layer and the third sub-layer comprise titanium oxide; and
      wherein the second sub-layer comprises hafnium oxide; and
   a barrier layer between the second conductive layer and the semiconductor layer;
      wherein the barrier layer chemically isolates the second conductive layer from the semiconductor layer; and
      wherein a work function of the first conductive layer is higher than a work function of the second conductive layer.

2. The memory cell of claim 1, wherein the first conductive layer comprises a non-noble material.

3. The memory cell of claim 1, wherein the first conductive layer comprises titanium nitride, silicon, or a silicide.

4. The memory cell of claim 1, wherein the semiconductor layer is doped with at least one of silicon, nitrogen, fluorine, chromium, lanthanum, cerium, praseodymium, neodymium, gadolinium, erbium, ytterbium, or lutetium.

5. The memory cell of claim 1, further comprising a current steering element connected in series with the semiconductor layer.

6. The memory cell of claim 5, wherein the current steering element is one of a diode, a p-i-n diode, a silicon diode, a silicon p-i-n diode, or a transistor.

7. The memory cell of claim 1, wherein the barrier layer comprises titanium oxide.

8. The memory cell of claim 7, wherein the second conductive layer comprises titanium nitride.

9. The memory cell of claim 1, wherein the barrier layer is between about 50 Å and about 75 Å thick.

10. The memory cell of claim 1, wherein the barrier layer is in direct contact with the semiconductor layer.

11. The memory cell of claim 1, wherein each of the second conductive layer and the barrier layer comprises an element.

12. The memory cell of claim 11, wherein the barrier layer comprises an oxide of the element.

13. The memory cell of claim 12, wherein the element is one of silicon or titanium.

14. The memory cell of claim 12, wherein the element is titanium.

15. The memory cell of claim 1, further comprising a voltage regulation circuitry being adapted to apply a set pulse to one of the first conductive layer or the second conductive layer while a remaining one of the first conductive layer or the second conductive layer being coupled to a voltage return path.

16. The memory cell of claim 1, wherein the memory cell is a bipolar memory cell such that a set pulse switching the semiconductor layer from a high resistive state to a low resistive state has an opposite polarity than a reset pulse switching the semiconductor layer from the low resistive state to the high resistive state.

17. The memory cell of claim 16, wherein the set pulse switching the semiconductor layer from the high resistive state to the low resistive state has an opposite polarity than a forming pulse switching the semiconductor layer initially into the low resistive state.

* * * * *